US008402343B2

(12) United States Patent
Radulescu

(10) Patent No.: US 8,402,343 B2
(45) Date of Patent: Mar. 19, 2013

(54) RELIABLE PACKET CUT-THROUGH

(75) Inventor: Andrei Radulescu, Eindhoven (NL)

(73) Assignee: ST-Ericsson SA, Plan-les-Ouates (CH)

( * ) Notice: Subject to any disclaimer, the term of this patent is extended or adjusted under 35 U.S.C. 154(b) by 258 days.

(21) Appl. No.: 12/958,745

(22) Filed: Dec. 2, 2010

(65) Prior Publication Data
US 2011/0161777 A1 Jun. 30, 2011

Related U.S. Application Data

(60) Provisional application No. 61/266,747, filed on Dec. 4, 2009.

(51) Int. Cl.
G06F 11/00 (2006.01)
(52) U.S. Cl. ........................................ 714/758
(58) Field of Classification Search .................. 714/758
See application file for complete search history.

(56) References Cited

U.S. PATENT DOCUMENTS

| 8,001,280 | B2 * | 8/2011 | Blumrich et al. | 709/252 |
| 2002/0087716 | A1 * | 7/2002 | Mustafa | 709/236 |
| 2008/0022184 | A1 * | 1/2008 | Jeong et al. | 714/758 |
| 2011/0219280 | A1 * | 9/2011 | Blumrich et al. | 714/748 |

FOREIGN PATENT DOCUMENTS

| WO | 2000/079359 | A2 | 12/2000 |
| WO | 2006/020298 | A2 | 2/2006 |
| WO | 2009090255 | A2 | 7/2009 |

OTHER PUBLICATIONS

International Search Report issued in corresponding International application No. PCT/EP2010/068842; mailing date Feb. 25, 2011.
Adiga, N. R. et al., "Blue Gene/L torus interconnection network", IBM Journal of Research and Development, International Business Machines Corporation, New York, NY, USA, vol. 49, No. 2-3, Mar. 1, 2005, pp. 265-276, XP002496339, ISSN: 0018-8646.
Galataki, Despo, "Design & Verification of UniPro Protocols for Mobile Phones", Internet Citation, Jul. 2009, pp. 1-86, XP002617612, Retrieved from the Internet: URL: http://www.cs.vu.nl/{tcs/mt/galataki.pdf.
Anonymous, "Switches", Intel Website, Product Support, Dec. 7, 2005, pp. 1-2, Retrieved from Internet: URL: http://web.archive.org/web/20051207231726 and http://www.intel.com/support/express/switches/sb/cs-014410.htm.
International Preliminary Report on Patentability and Written Opinion of the International Searching Authority issued on Jun. 5, 2012.
Boden, N. J. et al., "Myrinet: A Gigabit-per-Second Local Area Network", IEEE Service Center, Los Alamitos, CA, US, vol. 15, No. 1, Feb. 1, 1995, pp. 29-36, XP000501486, ISSN: 0272-1732, DOI: 10.1109/40.342015, pp. 29-32.

* cited by examiner

*Primary Examiner* — Bryce Bonzo
(74) *Attorney, Agent, or Firm* — Potomac Patent Group PLLC

(57) ABSTRACT

A cut-through data packet mechanism is described. Forwarding of a cut-through data packet by an intermediary node enables packet transmission of the cut-through data packet to begin prior to performing a frame CRC on the packet. The CRC is instead performed while transmission of the packet is occurring. If one or more errors are found in the cut-through data packet, then a packet trailer indicating such errors is transmitted toward an endpoint node that receives the cut-through packet.

25 Claims, 14 Drawing Sheets

MESSAGE SEQUENCE CHART EXEMPLIFYING THE UNIPRO ERROR HANDLING MECHANISM

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 1 | \multicolumn{7}{c}{ESC_DL} | | | | | | CTRL_ID = SOF | | | TCx | | RESERVED | |
| 0 | L3s=1 | \multicolumn{7}{c}{DESTINATION DEVICEID} | | | | | | L4s=1 | DESTINATION PORT = 0 | | | FCT | EoM |
| 0 | \multicolumn{16}{c}{PAYLOAD} | | | | | | | | | | | |
| 1 | \multicolumn{7}{c}{ESC_DL} | | | | | | CTRL_ID = EOF | | | SEQUENCE NUMBER | | | |
| 0 | \multicolumn{16}{c}{CRC} | | | | | | | | | | | |

EOF-BASED DATA FRAME

FIG. 1

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 1 | \multicolumn{7}{c}{ESC_DL} | | | | | | CTRL_ID = SOF | | | TCx | | RESERVED | |
| 0 | \multicolumn{7}{c}{FRAME LENGTH ( IN BYTES, INCLUDING L3/L4 HEADER)} | | | | | | RESERVED | | | FRAME SEQUENCE NUMBER | | | |
| 0 | L3s=1 | \multicolumn{7}{c}{DESTINATION DEVICEID} | | | | | | L4s=1 | DESTINATION PORT = 0 | | | FCT | EoM |
| 0 | \multicolumn{16}{c}{PAYLOAD} | | | | | | | | | | | |
| 0 | \multicolumn{16}{c}{CRC} | | | | | | | | | | | |

LENGTH-BASED DATA FRAME

FIG. 2

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 1 | \multicolumn{7}{c}{ESC_DL} | | | | | | CTRL_ID = SOF | | | TCx=0/1 | | hCRC=0 | Rsvd=1 | Nok |
| 0 | \multicolumn{3}{c}{FRAME SEQUENCE NUMBER} | | | RESERVED | | | \multicolumn{8}{c}{FRAME LENGTH ( IN BYTES, INCLUDING L3/L4 HEADER)} | | | | | | |
| 0 | L3s=1 | \multicolumn{7}{c}{DESTINATION DEVICEID} | | | | | | L4s=1 | DESTINATION PORT | | | FCT | EoM |
| 0 | \multicolumn{16}{c}{HEADER CRC} | | | | | | | | | | | |
| 0 | \multicolumn{16}{c}{PAYLOAD} | | | | | | | | | | | |
| 0 | \multicolumn{16}{c}{FRAME CRC} | | | | | | | | | | | |

LENGTH-BASED DATA FRAME WITH HEADER CRC

FIG. 3

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 1 | ESC_DL |||||||| CTRL_ID = AFC ||| TCx || REQ | RESERVED ||
| 0 | SEQUENCE NUMBER |||| RESERVED ||| CREDIT |||||||||
| 0 | CRC ||||||||||||||||

AFC CONTROL FRAME

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 1 | ESC_DL |||||||| CTRL_ID = NAC ||| RESERVED |||| RRR |
| 0 | CRC ||||||||||||||||

NAC CONTROL FRAME

MESSAGE SEQUENCE CHART EXEMPLIFYING THE UNIPRO ERROR HANDLING MECHANISM

RECEIVER SYMBOL PARSER FOR ERROR DETECTION

PROCEDURE CALLED FOLLOWING AN ERROR DETECTION

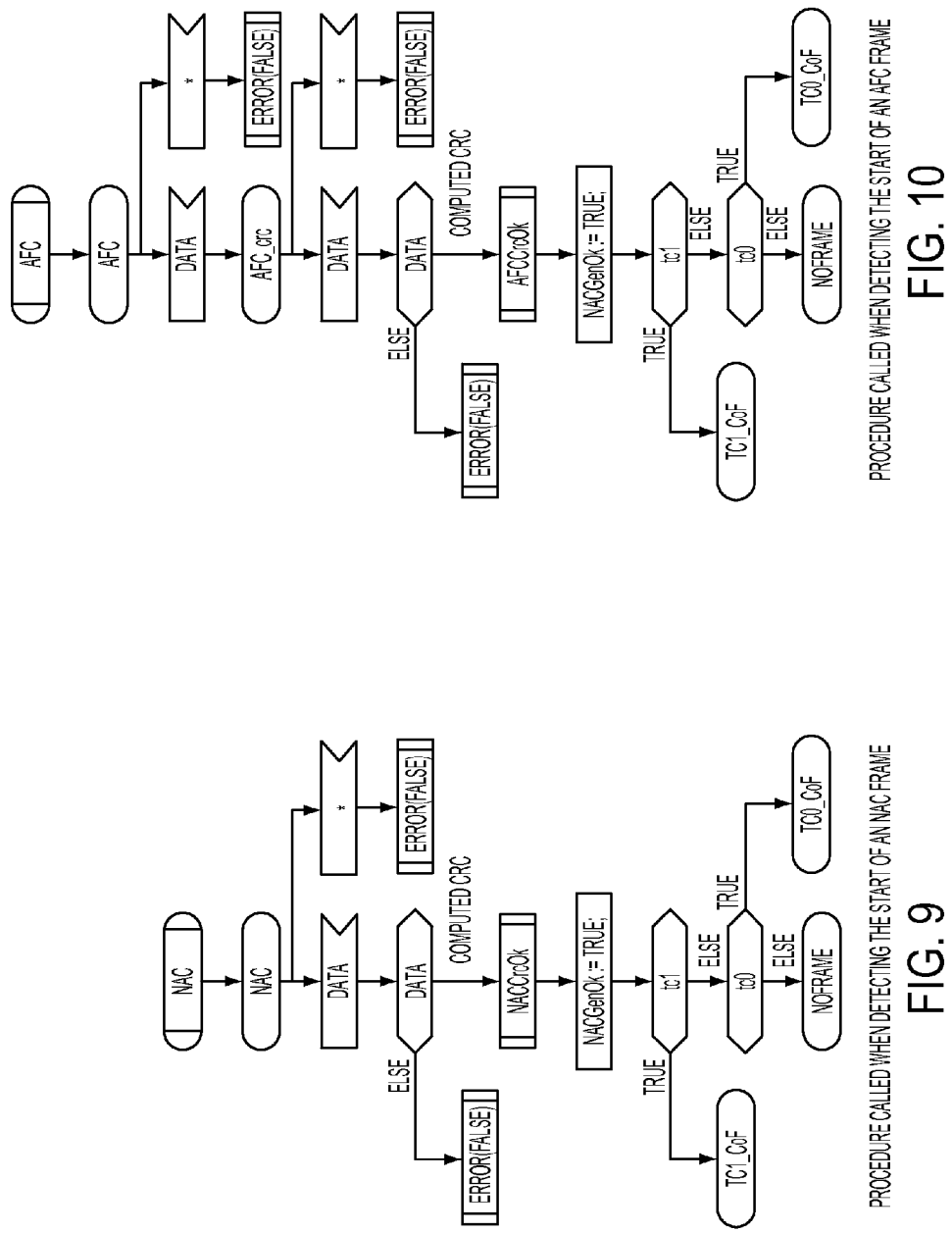

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 1 | ESC_DL |||||||| CTRL_ID = SOF |||| TCx=0/1 || hCRC=0 | Rsvd=1 | Nok |
| 0 | FRAME SEQUENCE NUMBER |||| RESERVED ||| FRAME LENGTH (IN BYTES, INCLUDING L3/L4 HEADER) |||||||||
| 0 | L3s=1 | DESTINATION DEVICEID |||||| L4s=1 | DESTINATION PORT |||||| FCT | EoM |
| 0 | HEADER CRC ||||||||||||||||
| 0 | PAYLOAD ||||||||||||||||
| 1 | ESC_DL |||||||| CTRL_ID = EOF_ERR |||| RESERVED |||||
| 0 | FRAME CRC ||||||||||||||||

FIG. 14A

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 1 | ESC_DL |||||||| CTRL_ID = SOF |||| TCx ||| RESERVED |||
| 0 | L3s=1 | DESTINATION DEVICEID |||||| L4s=1 | DESTINATION PORT = 0 |||||| FCT | EoM |
| 0 | PAYLOAD ||||||||||||||||
| 1 | ESC_DL |||||||| CTRL_ID = EOF_ERR |||| SEQUENCE NUMBER |||||
| 0 | CRC ||||||||||||||||

FIG. 14B

TC0 UNIPRO Rx MODIFICATION TO SUPPORT CUT THROUGH

RELIABLE PACKET CUT-THROUGH

RELATED APPLICATION

This application is related to, and claims priority from, U.S. Provisional Patent Application Ser. No. 61/266,747, entitled "Methods and Systems for Reliable Packet Cut-Through", filed on Dec. 4, 2009, the disclosure of which is incorporated here by reference.

TECHNICAL FIELD

The present invention relates generally to digital circuits and more specifically to the energy usage of digital circuits.

BACKGROUND

In the Mobile Industry Processor Interface Alliance [MIPI], several standards are defined. One of these standards is called UniPro (Unified Protocol), which is aimed at chip-to-chip networks using high-speed serial links [UniPro 1]. UniPro is defined to be a general purpose protocol that solves the general interconnect problems, such as error handling, flow control, routing or arbitration. UniPro is intended to increase the flexibility of phone manufacturers by mixing and matching chips with different functionalities, potentially from different vendors for easy creation of new devices.

UniPro has a fairly complex error handling procedure to provide reliable communication at the link level. The UniPro error handling is based on error detection based on CRC codes, error reporting using NAC frames, and data frame retransmissions in case of errors. Sequence numbers make sure that data frames are sent in order, and prevents frames being lost or duplicated. Sequence numbers are also essential in managing the retransmission buffer at the transmitter side, by removing the frames from the retransmission buffer once they are reported correctly received.

In addition to the CRC-based error detection, UniPro also uses timers to address error corner cases. Two timers are used, one to protect against frame acknowledgments and flow-control credits being lost, respectively.

This error handling requires that the data frames are only processed after their CRC is verified. While this pre-processing of the CRC may be a requirement when the packets are delivered at the receiver application, it is inefficient in intervening nodes, e.g., in UniPro network nodes such as UniPro switches, where it increases latency associated with data frame delivery.

Although the present handling is adequate, the inventor found it desirable to have methods and nodes which have less latency in such communication systems, and provide a more reliable packet cut-through mechanism.

SUMMARY

A cut-through data packet mechanism is described. Forwarding of a cut-through data packet by an intermediary node enables packet transmission of the cut-through data packet to begin prior to performing a frame CRC on the packet. The CRC is instead performed while transmission of the packet is occurring. If one or more errors are found in the cut-through data packet, then a packet trailer indicating such errors is transmitted toward an endpoint node that receives the cut-through packet.

According to one exemplary embodiment, a method for transmitting data toward an endpoint node includes the steps of: receiving, at an intermediary node, a first data frame, beginning to retransmit, by the intermediary node, the data packet contained in the first data frame toward the endpoint node in a second data frame prior to performing a first cyclic redundancy check (CRC) using a frame CRC field in the first data frame, the frame CRC field having been computed based on at least one non-CRC field of the first data frame, performing, by the intermediary node and subsequent to beginning the retransmitting, the first CRC on the first data frame using the frame CRC field, determining, as a result of the first CRC and by the intermediary node, that the first data frame is corrupted, containing one or more errors, and transmitting, by the intermediary node toward the endpoint node, a frame trailer associated with the second data frame which indicates that the data packet contained in the second data frame is corrupted.

According to another exemplary embodiment, a switching device includes a first interface configured to receive a first data frame, a second interface configured to begin retransmitting the data packet contained in the first data frame as a second data frame toward an endpoint prior to performing a first cyclic redundancy check (CRC) using a frame CRC field in the first data frame, the frame CRC field having been computed based on at least one non-CRC field of the first data frame, an interface controller configured to control first and second interfaces, a processor configured to perform, subsequent to beginning the retransmitting, the first CRC on the first data frame using the frame CRC field and to determine, as a result of the CRC on the first data frame, that first data frame is corrupted, containing one or more errors, and the switching device is further configured to transmit, via the second interface, a frame trailer associated with the second data frame which indicates that the data packet contained in the second data frame is corrupted.

According to another exemplary embodiment, a receiver includes an interface configured to receive a cut-through data frame, a processor configured to evaluate a data field other than a cyclic redundancy check (CRC) field associated with the cut-through data frame to determine whether the cut-through data frame is corrupted, containing one or more errors.

According to still another exemplary embodiment, a method for receiving a data frame comprising a data packet and having a first frame trailer, at a frame data receiver, includes the steps of receiving the data frame on a first interface of the frame data receiver, performing, by the frame data receiver, a cyclic redundancy check (CRC) using a frame CRC field in the data frame, the frame CRC field having been computed based on at least one non-CRC field of the data frame, determining, as a result of the first CRC and by the frame data receiver, that the data frame is not corrupted, and determining from the frame trailer that the data packet is corrupted, and taking an associated action.

BRIEF DESCRIPTION OF THE DRAWINGS

The accompanying drawings illustrate, among other things, exemplary embodiments of the present invention, wherein:

FIG. 1 illustrates an EOF-based data frame;
FIG. 2 illustrates a length-based data frame;
FIG. 3 illustrates a length-based data frame with a header CRC field.

FIG. 9 illustrates a procedure which is called when detecting the start of a NAC frame;

FIG. 10 shows a procedure called when detecting the start of an AFC frame;

FIGS. 14(*a*) and (*b*) depict packet formats including a packet trailer according to exemplary embodiments;

ABBREVIATIONS AND ACRONYMS LIST

Figures 4, 5, 6:
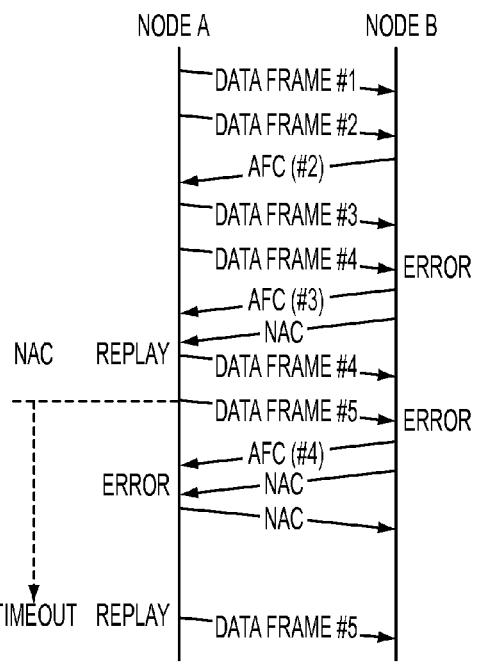
FIG. 4 depicts an AFC control frame.
FIG. 5 shows a NAC control frame.
FIG. 6 shows a message sequence chart exemplifying the UniPro error handling mechanism.

ACK Acknowledge Message
AFC Acknowledgment and Flow Control
COF Continuation Of Frame
CRC Cyclic Redundancy Check
CRCF Cyclic Redundancy Check Frame
CRCH Cyclic Redundancy Check Header
CTRL_ID Control Identifier
DL_MTU Data Link Maximum Transmission Unit (i.e., frame's maximum payload)
EOF End Of Frame
EOF_ERR End of Frame Error
EOF_PAD End Of Frame (with a padding byte)
EoM End of Message
ESC_DL ESCape character for Data Link layer
FCT Flow Control token
L3s Layer 3 Short header
L4s Layer 4 Short header
MIPI Mobile Industry Processor Interface
NAC Negative Acknowledgment Control
NACCrc Negative Acknowledgment Control Cyclic Redundancy Check
NACGen Negative Acknowledgment Control Generation
PAerr (P)HY Adapter (err)or
PERR Packet ERRor
RRR Remote Reset Request, also referred to as RReq=Reset (Req)uest
Rx Receiver
SDL Specification Description Language
SOF Start Of Frame
TC Traffic Class
TC0_crc Traffic Class 0 CRC
UniPro Unified Protocol

DETAILED DESCRIPTION

The following detailed description of the exemplary embodiments refers to the accompanying drawings. The same reference numbers in different drawings identify the same or similar elements. Also, the following detailed description does not limit the invention. Instead, the scope of the invention is defined by the appended claims.

According to exemplary embodiments, data frames or packets can be "cut through" to improve latency. Here, packet "cut through" means that an incoming packet can be transmitted further before the CRC check is performed, e.g., in intervening UniPro nodes between the packet transmitter and the packet recipient. In this invention, we present a method which does packet cut through in a UniPro network. Among other things, exemplary embodiments provide for combining packet cut through with error handling, thus ensuring that an error detected for the transmission of a cut-through packet is propagated in the network, such that the erroneous packet is stopped. Exemplary embodiments prevent erroneous packets from being delivered, and ensure in-order data transmission. In order to provide some context for discussion of the exemplary embodiments, some information is first provided about UniPro protocols and systems in which these exemplary embodiments can be used. However it will be understood that the present invention is not limited to usage in UniPro standardized systems.

The UniPro protocol defines data and control frames for its link-level communication. Data frames encapsulate data from the application, while control frames are used by UniPro's data link layer protocol for its internal mechanisms. The UniPro protocol specification (1.00.00) defines the data frames as shown in FIG. 1. Therein, the first symbol and last two symbols of the UniPro data frame are the frame header and trailer, respectively. The header consists of a control symbol (identified by the bit $16^{th}$ with a value of 1), which has the following fields:

an escape byte (ESC_DL), which will be converted to an escape symbol in an encoded Phy, and denotes a control symbol the symbol control id field CTRL_ID, which in the case of a data frame header has a value of 0, denoted by SOF (Start Of Frame) in FIG. 1, the traffic class TCx, for which UniPro 1.0 allows the values 0 and 1, and three reserved bits The trailer consists of two symbols: the EOF control symbol (the $16^{th}$ bit is 1), and the CRC data symbol (the $16^{th}$ bit is 0) for error detection. The EOF control symbol consists of:

an escape byte (ESC_DL), as for the SOF control symbol in the header, the symbol control id field, which in the case of a data frame trailer has either a value of 1 denoted by EOF (End Of Frame) for a payload with an even number of bytes, or a value of 2 denoted by EOF_PAD (End Of Frame with a padding byte) for a payload with an odd number of bytes, and the frame sequence number In UniPro version 1.5, it is possible that the data frame format changes to use a frame length (instead of an EOF/EOF_PAD control symbol) field to identify where a frame ends, an example of which is shown in FIG. 2. As compared to the EOF-based data frame of FIG. 1, a data symbol is inserted in the frame header just after the SOF control symbol. This new data symbol contains the frame length, and the frame sequence number. The EOF control symbol is not present anymore. The rest of the data frame structure remains unchanged.

This new frame format is introduced to allow the introduction of an optional 16-bit header CRC, which is required by the real-time traffic class (expected to be part of the UniPro 2.0 specification), an example of which is shown in FIG. 3. The presence of the header CRC is indicated by the hCRC bit in the first header symbol. The header CRC also protects the L3 header (shown in FIG. 3 as bits 8:16 in the third word) and the L4 header (shown in FIG. 3 as bits 0:7 in the third word). The position of the header CRC is computed on the fly using bits in the L3 and L4 headers (i.e., L3s, L4s and the bits indicating extensions which are only used for long headers and are not shown here). To distinguish between the two CRCs in a frame, "header CRC" is used to denote the CRC protecting the header, and "frame CRC" is used to denote the CRC protecting the entire frame.

The UniPro 1.00.00 protocol has two control frames: the AFC (Acknowledgment and Flow Control) control frame shown in FIG. 4, and the NAC (Negative Acknowledgment) control frame shown in FIG. 5. The AFC control frame consists of three symbols: the AFC control symbol (the $16^{th}$ bit is 1), and two data symbols. The AFC control symbol consists of:

an escape byte (ESC_DL), as for the SOF control symbol in the header, the symbol control id field, which in the case of a data frame trailer has either a value of 6 denoted by AFC (Acknowledgment and Flow Control), the traffic class TCx, for which UniPro 1.0 allows the values 0 and 1.

the traffic class TCx, for which UniPro 1.0 allows the values 0 and 1, and a Req bit, used to request the peer side to send an AFC control frame at this traffic class, and two reserved bits.

The NAC control frame shown in FIG. 5 consists of two symbols: the NAC control symbol (the $16^{th}$ bit is 1), and one data symbols, the CRC used for error detection. The NAC control symbol consists of:

an escape byte (ESC_DL), as for the SOF control symbol in the header, the symbol control id field, which in the case of a data frame trailer has either a value of 5 denoted by NAC (Negative ACknowledgment), four reserved bits, and a RRR bit, used to request the peer side to resynchronize the link.

The second data symbol in the NAC control frame is the CRC used for error detection.

The UniPro link-level error handling scheme is based on error detection and data frame retransmission, and consists of two safety nets. The first safety net is fast and handles typical errors. The second safety net is slower and handles corner cases. UniPro systems add a CRC (Cyclic Redundancy Check) error detection code to each transmitted frame. The receiver re-computes the CRC and verifies it against the CRC received at the end of the frame. In the case the received frame is correct, the receiver commits it to the receive buffer and acknowledges the frame to the transmitter (for a data frame), or processes it (for a control frame). In case the receiver detects an error, it reports it back to the transmitter using a NAC frame.

All transmitted data frames are assigned a sequence number, which is also transmitted in the data frame, and is used by the receiver for acknowledgment. The UniPro sequence number has 5 bits. The reset value is 0, and is used for the first data frame transmission. The sequence number is incremented with every frame transmitted/received and wraps around at 31. In UniPro, at most 16 frames can be transmitted without receiving an acknowledgment. Frame acknowledgment is performed using ACK control frames. When acknowledging frames, the sequence number in the AFC frame acknowledges all unacknowledged data frames up to and including the one identified by the sequence number.

The transmitter saves all transmitted data frames in a retransmission buffer until acknowledged. In the case a NAC control frame is received (reporting an error), all data frames in the retransmission buffer are retransmitted starting with the oldest unacknowledged frame.

The second safety net is used for the cases in which one or more of the AFC or NAC frames are lost. In such cases, either the acknowledgments and/or link-level flow control credits contained in an AFC frame are lost, or an error indication contained in an NAC frame is lost. To protect against such (rare) errors, for each traffic class, two timers are used: one for data, called replay timer, and one for credits, called credit timer. When the replay timer expires, all the unacknowledged frames in that traffic class are retransmitted. When the credit timer expires, an AFC frame with the Req bit set is sent for that traffic class. In both cases, UniPro 1.00.00 requires the link to be resynchronized, after which an NAC frame with the RRR bit is sent to also require the incoming link to be resynchronized.

In addition to the CRC errors, as part of the first safety net, the receiver detects numerous other errors:

receiver buffer overflow (e.g., due to a bit transmission error in the TCx field), incoming data frame length larger than the maximum frame size DL_MTU (e.g., due to a transmission error changing the EOF control symbol into a valid data symbol), incorrect sequence number in a data frame, an AFC frame not followed by two data symbols, an NAC frame not followed by one data symbol, an EOF/EOF_PAD not followed by one data symbol, reception of a COF, EOF or EOF_PAD control symbol when no data frame has been started, reception of an SOF symbol when a data frame of the same traffic class is already ongoing and the data frame is not currently pre-empted (during a pre-emption by AFC and/or NAC, SOF reception may indicate the start of a re-transmission, and, therefore, is not considered an error), reception of an SOF symbol for TC0 when a TC1 data frame is already ongoing (TC0 cannot pre-empt TC1), reception of a COF symbol during a data frame of the same traffic class, when that data frame has not been pre-empted, reception of a COF symbol continuing a data frame of a different TC, reception of an EOF, EOF_PAD or a data symbol when a data frame is pre-empted and the pre-empting frame has finished (for a pre-empted frame, a COF symbol, not an EOF symbol should follow), reception of a control symbol with invalid values for defined fields, e.g. undefined CTRL_ID or TC, reception of an error indication from the Phy Adapter.

The Phy Adapter indicates an error in the following cases a bad Phy symbol was received a correct exception Phy symbol was received, but it is not mapped to a valid UniPro symbol a correct exception Phy symbol was received immediately after another exception Phy symbol, when a data Phy symbol was expected an incorrect value of a valid data Phy symbol is received following am ESC_PA When any of the above errors is detected, a NAC control frame is transmitted, possibly preceded by a pair of AFC control frames to prevent unnecessary retransmissions.

In FIG. 6, a message sequence chart is shown to illustrate the first and second safety nets of the UniPro error handling mechanism. For simplicity reasons, a single traffic class is assumed. Therein, after correctly receiving data frames #1 and #2, Node B reports their correctness by sending to Node A an AFC frame carrying the sequence number of the last correctly received frame, #2 in this case. When Node A receives the AFC frame, it removes all the frames up to Frame #2 from the retransmission buffer. Node A continues sending Frames #3 and #4, however, only Frame #3 is correctly received, an error occurring in the transmission of Frame #4. This error is detected at Node B, which sends to Node A first an AFC to acknowledge the correct receipt of Frame #3, followed by an NAC frame reporting the error. When receiving the NAC, Node A retransmits all unacknowledged frames starting with the oldest, Frame #4 in this example (first safety net).

Node A follows up the retransmitted Frame #4 with Frame #5. Frame #4 is correctly received, but an error is detected for Frame #5 by Node B. Consequently, as in the previous case, am AFC frame is sent to report the correct receipt of Frame #4, and an NAC frame is sent to report the error. Unfortunately, also the NAC frame encounters a transmission error. Node A reports this error with a NAC, however, it doesn't know that it should retransmit Frame #5. Eventually, Node A's replay timer expires, and Node A retransmits Frame #5 (second safety net).

Figure 7:
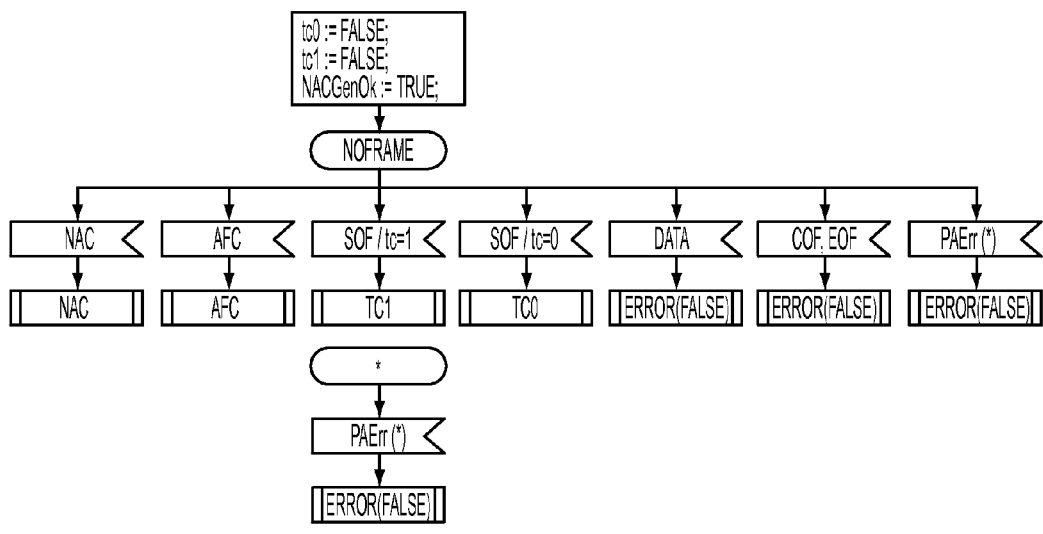
FIG. 7 depicts a receiver symbol parser for error detection.

Using SDL flow charts, FIG. 7 illustrates a possible partial implementation of the UniPro error detection mechanism. Therein, the top-level view of the symbol parser found in the receiver is described. The symbol parser maintains three variables: tc0 and tc1 to indicate if there is an ongoing data frame at TC0 and TC1, respectively, and NACGenOk to indicate if the NAC generation is validated (true) or not (false). Initially, there is no ongoing data frame, hence, tc0 and tc1 are both set to false. NAC generation is temporarily disabled after an error was reported with a NAC until a frame with a good CRC is received. Initially, there is no detected error, and, thus, NACGenOk is set to true.

Initially, the receiver symbol parser has not started any frame, and waits in the state NoFrame. When a start of frame symbol is received (NAC, AFC, SOF with a TC of 0 or 1) the corresponding procedure is called to receive the whole frame (NAC, AFC, TC1 and TC0, respectively). If any other symbol is received (data, COF, EOF or EOF_PAD, which is not shown for simplicity), the Error procedure is called with the parameter false. In any state, when an error indication is received from the Phy Adapter, the Error is called with the parameter false.

Figure 8:
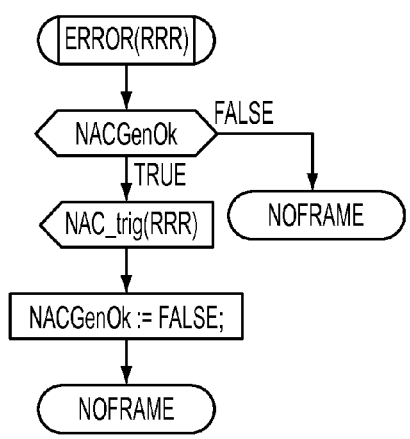
FIG. 8 shows a procedure called following an error detection.

In FIG. 8, the Error procedure is shown, which takes a parameter called RRR. If the NAC generation is enabled, a NAC frame is triggered, and the NAC generation is disabled. This NAC frame has the RRR bit set to the RRR value received as the procedure parameter. After an error was detected, the parser process always returns to state NoFrame.

In FIG. 9, the procedure for receiving a NAC frame is shown. After it received a NAC symbol, the NAC procedure is called, which waits in state NAC until a data symbol (the CRC) is received. If another symbol is received, this is an error which is reported when calling Error. If a data symbol is received, this should be the NAC frame's CRC, and it is verified against the CRC computed at the receiver (for simplicity, the CRC computation is not shown in these diagrams). If the CRC is incorrect, Error is called. If the CRC is correct, the NAC frame is committed with NACCrcOk, where the actions following the NAC receipt are taken. After this, NACGenOk is set to true (NAC generation is enabled after receiving a good frame). If tc1 is true, the TC1 is pre-empted and must be continued. Therefore, the symbol parser process goes to state TC1_CoF. Otherwise, if tc0 is true, the parser process goes to state TC0_CoF. If none of tc1 and tc0 are true, the parser process returns to state NoFrame.

In FIG. 10, the procedure for receiving an AFC frame is shown. After it received an AFC symbol, the AFC procedure is called, which waits in state AFC until the second data symbol of the AFC frame is received. If another symbol is received, this is an error which is reported when calling Error. Then, the AFC procedure waits in the AFC crc state until the second data symbol (the CRC) is received. Again, if any other symbol is received, this is an error, which is reported with Error. If the second data symbol is received, this should be the AFC frame's CRC, and it is verified against the CRC computed at the receiver (for simplicity, the CRC computation is not shown in these diagrams). If the CRC is incorrect, Error is called. If the CRC is correct, the AFC frame is committed with AFCCrcOk, where the actions following the AFC receipt are taken. After this, NACGenOk is set to true (NAC generation is enabled after receiving a good frame). If tc1 is true, the TC1 is pre-empted and must be continued. Therefore, the symbol parser process goes to state TC1_CoF. Otherwise, if tc0 is true, the parser process goes to state TC0_CoF. If none of tc1 and tc0 are true, the parser process returns to state NoFrame.

Figure 11:
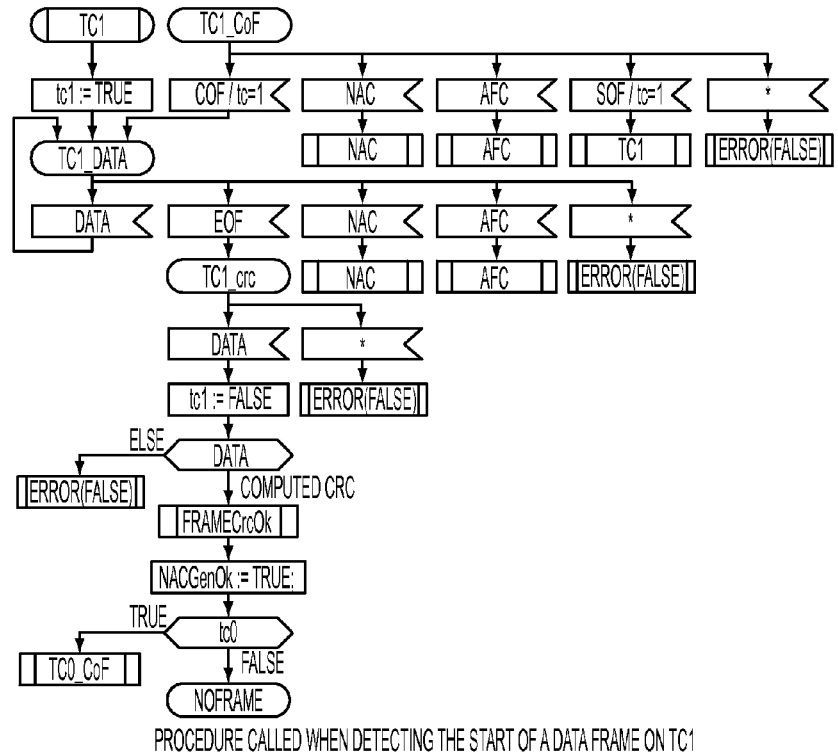
FIG. 11 depicts a procedure called when detecting the start of a data frame on TC1.

In FIG. 11, the procedure for receiving a data frame for TC1 is shown. After the parser receives an SOF symbol with the traffic class field set to 1, the TC1 procedure is called, which sets tc1 to true indicating the TC1 frame has started, and then waits in state TC1_data as long as it receives data symbols. While data is received, two errors can occur, which are not shown in the figure: buffer overflow and frame exceeding the DL_MTU. In both cases an error is reported with Error. From state TC1_data, the frame can be ended with EOF symbol or EOF_PAD symbol (EOF_PAD not shown for simplicity). After an EOF/EOF_PAD symbol, a data is expected (the CRC). if any other symbol is received, this is an error, reported by Error. If the CRC is received, the frame is finished (tc1 becomes false). The frame is committed if its CRC is correct, otherwise Error is called. After this, NACGenOk is set to true (NAC generation is enabled after receiving a good frame). The TC0 data frame pre-emption is checked using tc0, and if true, the TC0 data frame reception is continued in state TC1_CoF. Otherwise, the parser process returns to state NoFrame.

If in TC1_data, a pre-emption occurs (NAC or AFC symbols is received), the procedure for receiving that frame (NAC or AFC, respectively) is called. Any other symbol received in the TC1_data state (i.e., SOF or COF), and error is reported with Error. If the TC1 data frame was pre-empted, and the pre-empting frame finished, the parser returns in the state TC1_CoF. In this state, (1) the TC1 data frame can be continued when receiving a COF with the TC field set to 1, after which the parser continues in state TC1_data, or (2) another pre-emption by an NAC, AFC can start, or (3) an SOF symbol with the TC field set to 1 can be received indicating a possible retransmission. Any other symbol is an error, and reported using Error.

Figure 12:
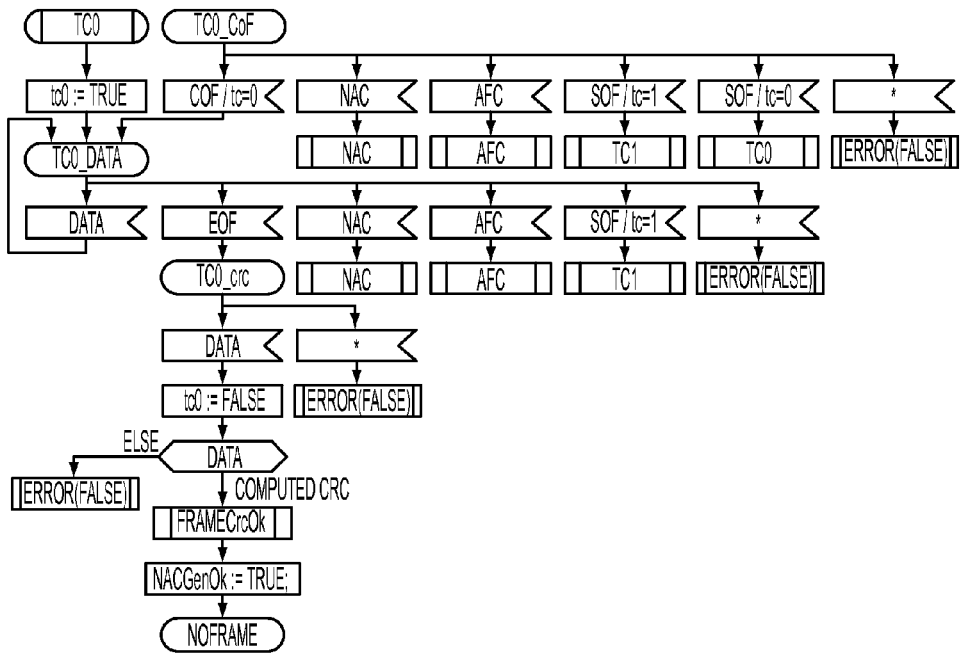
FIG. 12 shows a procedure called when detecting the start of a data frame on TC0.

In FIG. 12, the procedure for receiving a data frame for TC0 is shown. This is similar to the TC1 case. There are two differences. First, a TC0 frame may be pre-empted by a TC1 frame, which is shown by allowing an SOF symbol with the TC field set to 1 to be received during the payload (TC0_data state) or during a pre-emption (TC0_CoF state). Second, when a TC0 frame is finished, the parser always returns to the state NoFrame, as there is no other frame that can be continued (in the TC1 case, TC0 could be pre-empted, therefore a check is needed to determine if a TC0 needs to be continued in state TC0_CoF, or there is no ongoing frame in which case the parser returns to state NoFrame).

Figure 13:
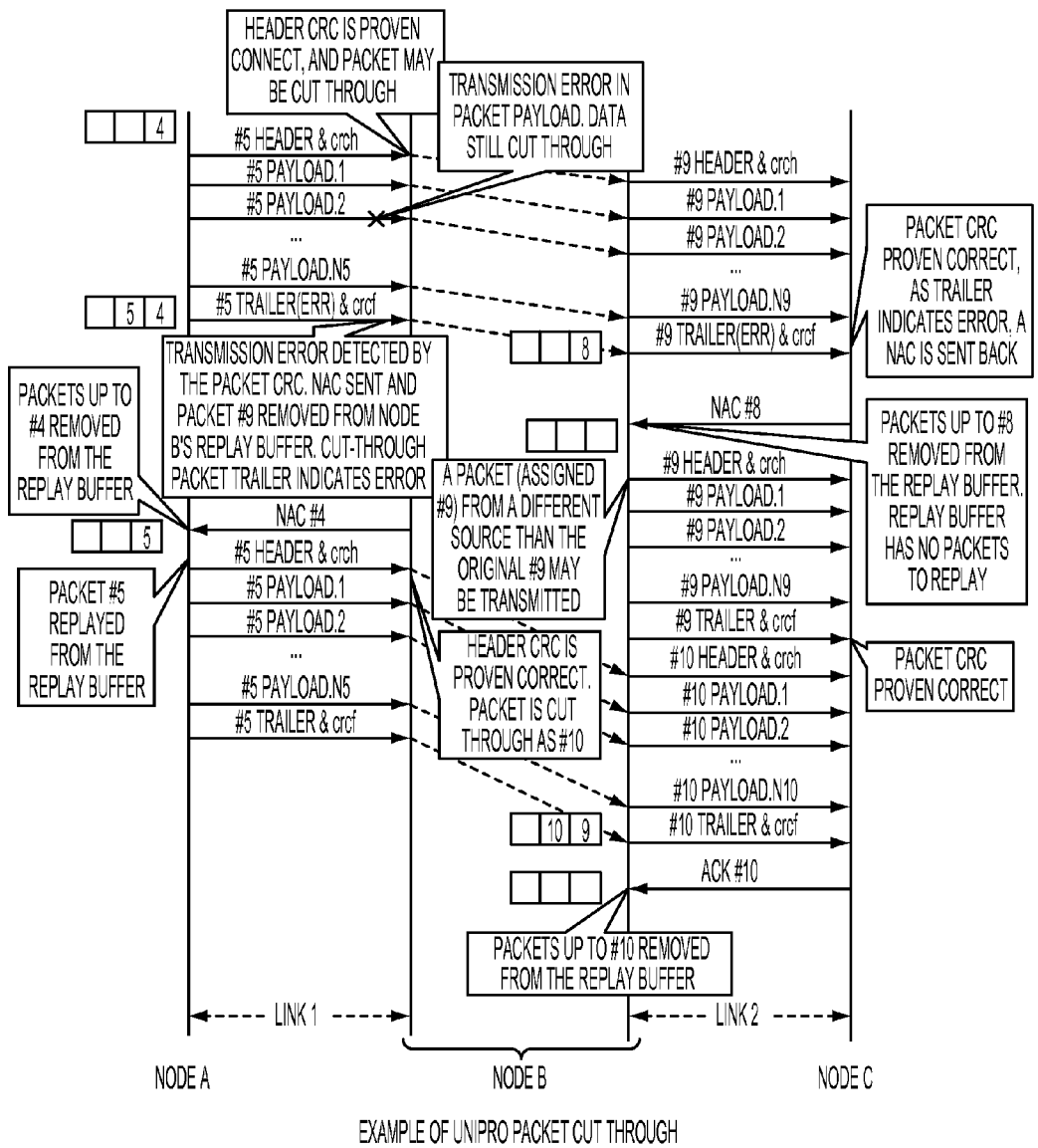
FIG. 13 illustrates an example of a UniPro packet cut-through according to an exemplary embodiment.

According to exemplary embodiments, a packet cut-through process may be performed at, for example, intermediary nodes wherein the packet is transmitted before the CRC check is performed. FIG. 13 shows Node A sending packets on Link 1, Node B receiving the sent packets on Link1, and cutting them through on Link 2, and node C receiving the packets. In this example, Node B can thus be considered to be an intermediary node, e.g., a switching device while Node C can be considered to be an endpoint node, e.g., a frame data receiver. Packets are depicted as having a header, which may be optionally protected by a header CRC (crch), several symbols of payload, and a trailer which also includes a frame CRC (crcf).

The frames may, according to exemplary embodiments, only be cut through immediately after the L3 DeviceID (address) was received. If the header is protected by a header CRC, it is better to only start the cut through after the header CRC is verified, e.g., by computing a CRC based on at least one non-CRC field in the frame header (and, possibly, on all of the non-CRC fields in the frame header), thus ensuring the L2-L4 header is correct. If the header CRC is corrupt, the frame is discarded and an error is reported. In the example in FIG. 13, a first frame (having the sequence number #5 on Link 1) is proven to have the header CRC correct at Node B, indicating a correct transmission on Link 1. As a result, the frame is cut through on Link 2 to Node C (with sequence number #9 on Link 2). If the header CRC was not present, the frame could have been cut through when the L3 DeviceID was received. The L3 DeviceID reception is needed to select the transmitter port at Node B.

In this example, Frame #5 encounters an error during its payload transmission on Link 1. However, the error is only detected when the frame CRC is checked, which is too late to prevent the frame from being cut through. As a result, after the frame CRC is checked, e.g., by computing a CRC based on at least one non-CRC field in the frame and, possibly, on all of the non-CRC fields in the frame, and the error is found, the cut through frame (Frame #9 on Link 2) is appended a trailer indicating that an error exists in the payload. One way the payload error can be indicated is to add a special Layer 2 symbol in the frame trailer (see, e.g., FIG. 14(a) which shows a length-based frame and FIG. 14(b) which shows an EOF frame). The term "special" in this context means that the Layer 2 symbol is one that the will be interpreted by an appropriately adapted receiver or intermediary node as being indicative of whether there is a payload error or not. The payload error can also be indicated by setting a flag in the frame trailer. This could be in a new frame trailer that might have been added at the intermediary node, or it could be in an existing frame trailer, i.e. a frame trailer of the frame that arrives at the intermediary node. It is clear to a person skilled in the art that distinguishing between a presence and an absence of a payload error can be done either by having a set flag in case of payload error and having a cleared flag in case of no payload error, or vice versa, having a set flag in case of no payload error and having a cleared flag in case of payload error. Whether the payload error is indicated via a special Layer 2 symbol or via a flag, a correct frame CRC is appended by the transmitter. With both options, the receiver of the frame treats the frame in the same way: If the frame is reliable, the frame is discarded. Optionally, an error is indicated back to the transmitter using a NAC frame. If the frame is real-time, the frame is discarded and an error is reported back only if the real-time frame can be retransmitted, as indicated by its replay flag. Otherwise (when no retransmission is allowed), the real-time frame is accepted and transmitted further, however, marked as carrying an erroneous payload.

An alternative way to indicate the payload error is by poisoning the frame CRC (i.e., inserting an erroneous CRC) at the transmitter. However, in this case it is not possible to distinguish between an error occurring on the current link and an error occurring on a previous link. Consequently, a protocol using this method would be limited in the choice of options it has when treating these errors.

The NAC frames are shown to carry a sequence number. This is in principle possible in a protocol, however, not permitted by UniPro. To compensate for the lack of sequence numbers in UniPro, the NAC frame can be preceded by AFC frames to carry the sequence numbers of the last correctly received frames. When the frame is protected by a header CRC, the frame traffic class is known to be correct. As a result, the NAC frames reporting the error may be flagged to indicate the traffic class where the error occurred. In this way, the transmitter can be more selective, and only take retransmission actions on the affected traffic class.

After the NAC is received on Link 1, Frame 4 (reported by the NAC as being correctly received) is removed from Node A's retransmission buffer, and Frame 5 retransmitted. On Link 2, the NAC frame reported Frame 8 as correctly received, resulting in Frame 8 being removed from Node B's retransmission buffer. However, the original cut-through cannot be retransmitted, as it was flagged as corrupted and not saved in Node B's retransmission buffer (frames committed to retransmission buffers only when proven correct by the frame CRC). Other frames may be available from other links, and those can be transmitted (e.g., second Frame #9 in FIG. 13). In the case of a retransmitted frame (e.g., reliable frame), the original cut-through frame will eventually come, and be transmitted as Frame 10.

In FIG. 13, the NAC frame sent in response to detecting the Frame 9 error is necessary for real-time data frames. In the case of a reliable data frame which is labeled as corrupt with an EOF_ERR trailer (also alternatively referred to as a PERR trailer), the transmission of the NAC frame can be skipped. In an alternative embodiment, when it receives the EOF_ERR indication, Node B can directly remove Frame 9 from the retransmission buffer and automatically roll back the frame sequence number and credits.

Figure 15:
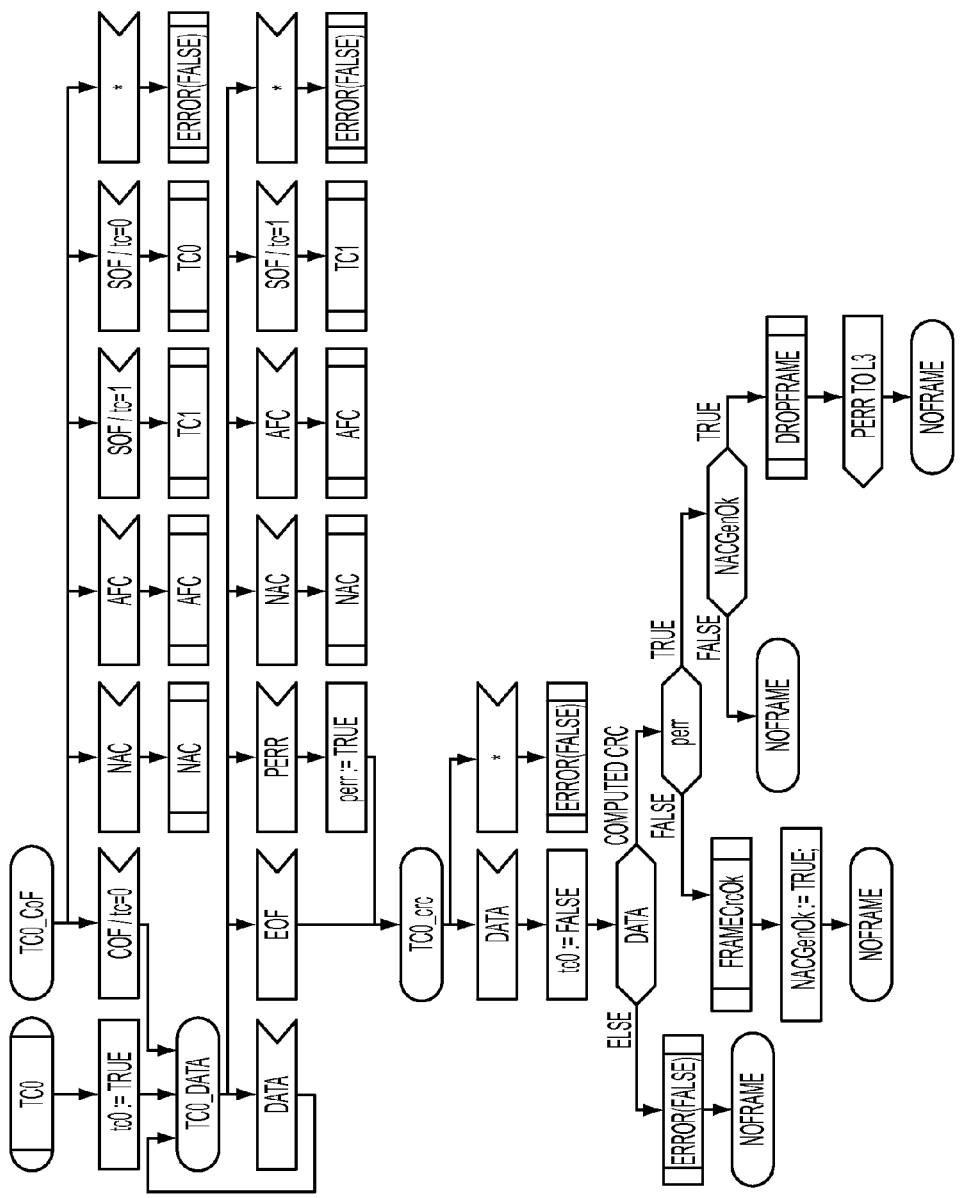
FIG. 15 shows TC0 UniPro receiver modification to support packet cut-through according to an exemplary embodiment.

In order to implement the packet cut through technique described above according to the exemplary embodiment of FIGS. 13 and 14(a) and (b), some modifications to, for example, UniPro nodes can be made. For example, the UniPro L2 receiver parser has to be able to handle the additional symbol indicating a corrupt payload in a frame having a correct frame CRC. In FIG. 15, an example is shown for a receiver using EoF-based frames. For such a case, the Rx must also be able to receive the EOF_ERR L2 symbol to come instead of the EOF L2 symbol. If the EOF_ERR symbol is received, the EOF_ERR variable is set to true, such that, in State TC0_crc, if the frame CRC is proven correct, then the normal error procedure is taken (NAC generation if enabled), however, without setting the NACGenOk to true. For the other parts of the Rx (e.g., TC1, AFC, etc), or an Rx for a modified version of the frame format, the changes are similar.

A UniPro L2 receiver which does not need to deal with cut through packets saves the incoming data in the Rx buffer until the frame CRC proves the frame correct. The frame is only made available to Layer 3 after the frame was proven correct. However for the cut-through case, the frame has to be made available to Layer 3 before the frame CRC check. A natural time would be to start supplying the frame to Layer 3 right after the Layer 2 header was received, however other alternatives are possible. The UniPro Layer 2 according to this exemplary embodiment also provides an indication to Layer 3 to indicate the frame payload is corrupted (either because it was labelled as such, or the frame CRC is wrong). After the packet is routed in Layer 3, this indication is delivered to the Layer 2 at the transmitter port. The UniPro Layer 2 transmitter labels the outgoing data frames as having an erroneous payload (e.g., by appending an EOF_ERR symbol). For reliable frames and real-time frames that can be retransmitted, if the payload is corrupt, the frame is removed from the retransmission buffer. This results in rolling back the transmitted-frame sequence number by one. For a reliable frame, the available Layer 2 used flow-control credits are rolled back by the amount of credits consumed when transmitting the cut-through frame. For reliable frames and real-time frames that can be retransmitted, the receiver also removes the frames marked with EOF_ERR from its Rx buffer. This also results in not advancing the expected sequence number (as is the case with a correct frame).

According to exemplary embodiments, methods, devices and systems enable allows the packets to be started being sent early within a network, i.e., before the frame CRC is received and verified. In this way, the delay penalty introduced by the CRC checks is only paid once, when the packets are delivered to the final destination. As a result, the transmission latency is reduced significantly. To quantify this benefit, and purely as an illustrative example, if a packet would be sent via 3 links, taking approx. 1 µs for each link (due to the frame CRC check), the total packet latency is 3 µs. When cut through, the packet delay on the first 2 links can be reduced to approx. 100 ns, leading to a total packet latency of 1.2 µs.

Figure 16:
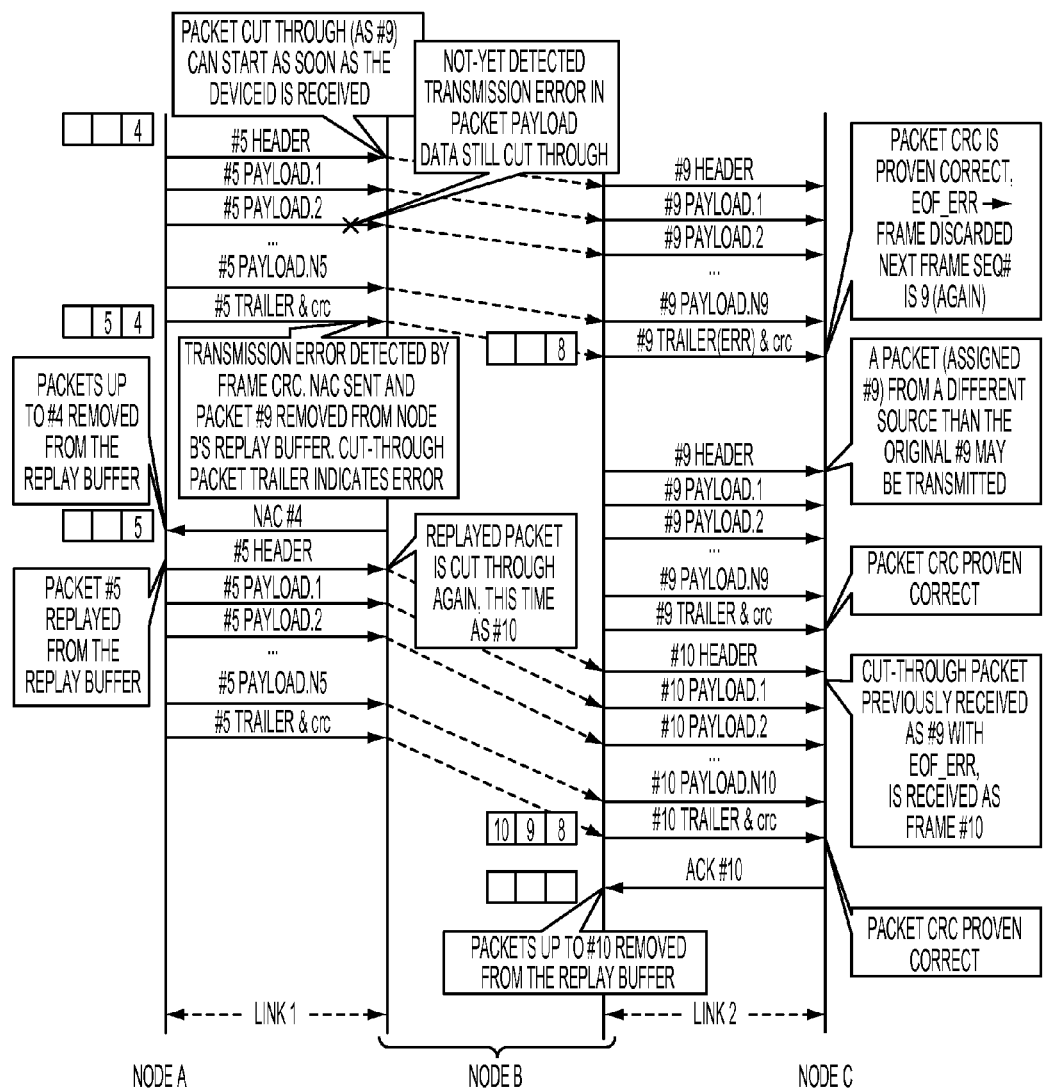
FIG. 16 illustrates a TC0/TC1 packet cut-through according to another exemplary embodiment.
Figures 17A, 17B:
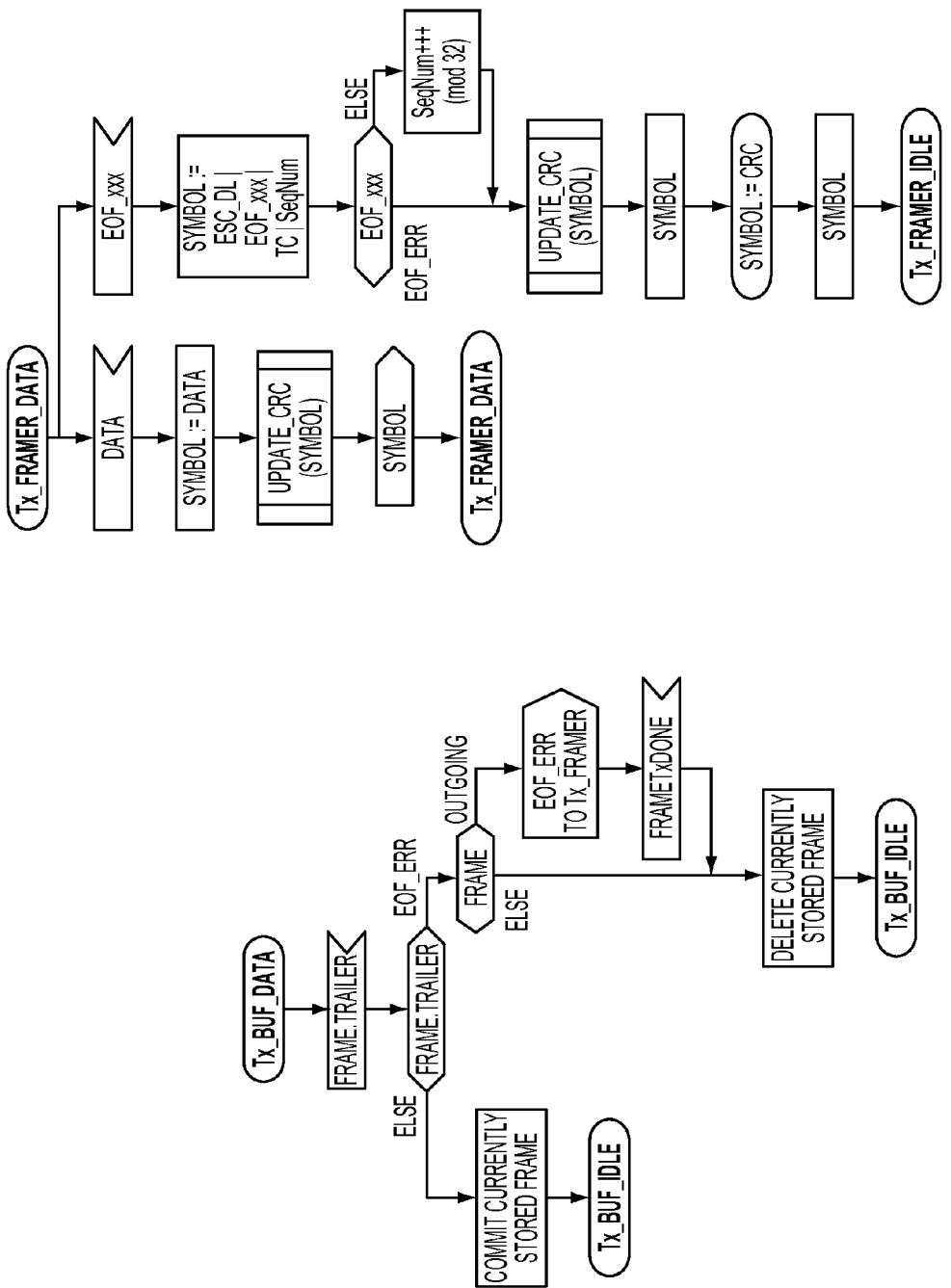
FIGS. 17(*a*)-(*b*) and 18 show corresponding transmitter state machines and receiver state machines, respectively, associated with the exemplary embodiment of FIG. 16.
Figure 18:
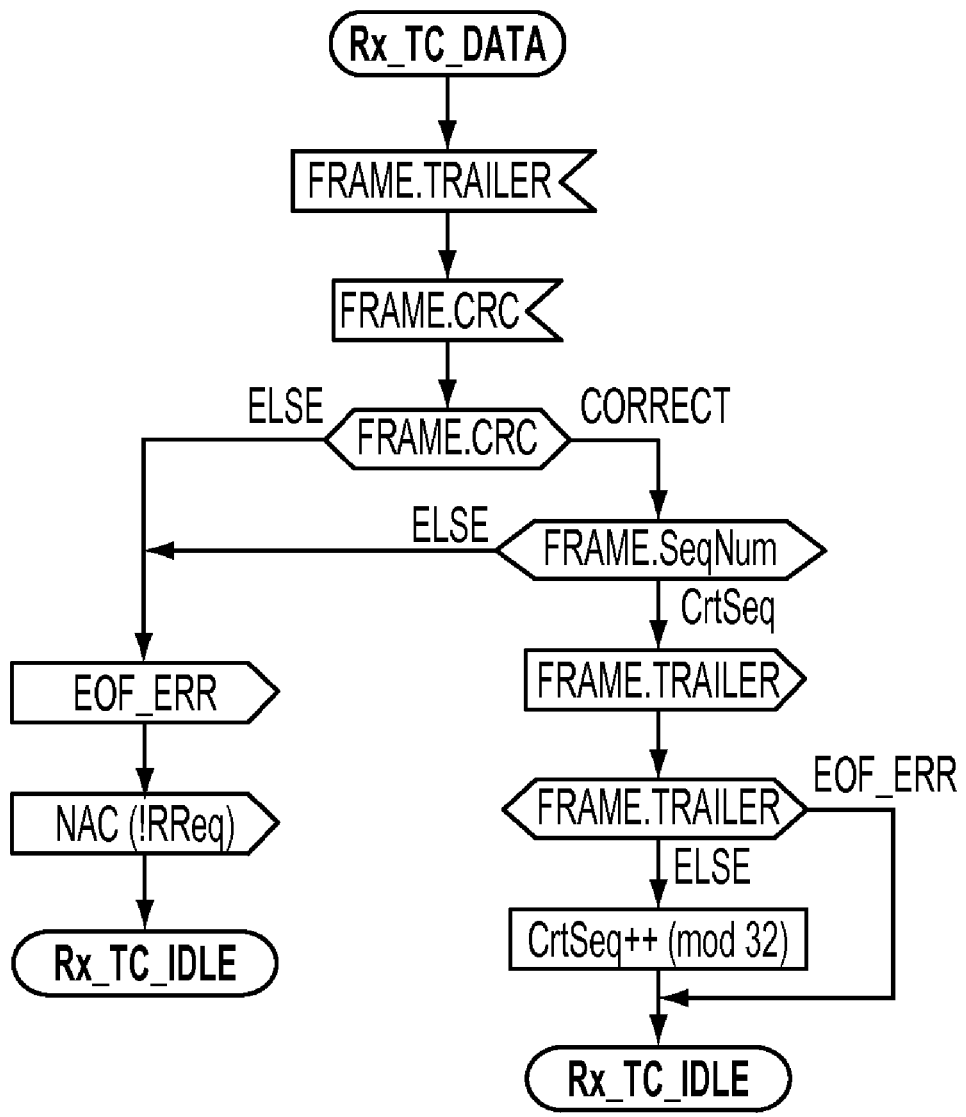

Another exemplary embodiment, similar to that of FIG. 13 is provided as FIG. 16 which illustrates a TC0/TC1 packet cut through. At the switch, the cut through can start when DeviceID is received, whereas at an endpoint no cut through is performed since the payload should have its CRC check performed. If an error is detected at the receiver, all ongoing cut-through packets are labeled erroneous with an EOF_ERR trailer and a NAC is generated. The cut-through packet is stored in a Tx replay buffer and is committed if good frame CRC or deleted if (CRC) error or EOF_ERR reported from local Rx. If the Tx receives NAC, then it replays all unacknowledged committed frames and frames are renumbered if invalid cut-through frames were received. To accommodate this functionality according to exemplary embodiments, an EOF_ERR control symbol is added, which symbol is also used for TC2 to indicate payload error. In case of errors, already-transmitted frames with EOF_ERR are skipped by L2 retransmission and L2 retransmission may re-numbered frames due to skipped invalid frames. Corresponding transmitter state machines and receiver state machines are illustrated as FIGS. 17(*a*)-(*b*) and 18, respectively.

According to these exemplary embodiments, a length-based frame with header CRC provides for earlier error recovery when header errors occur. When TC is proven correct, this avoids buffer overflows caused by wrong TC and avoids accidental bandwidth claims in case of bandwidth reservation (v2.0). When DeviceID is proven correct, this prevents accidental load of other links due to a DeviceID error.

Figure 19:
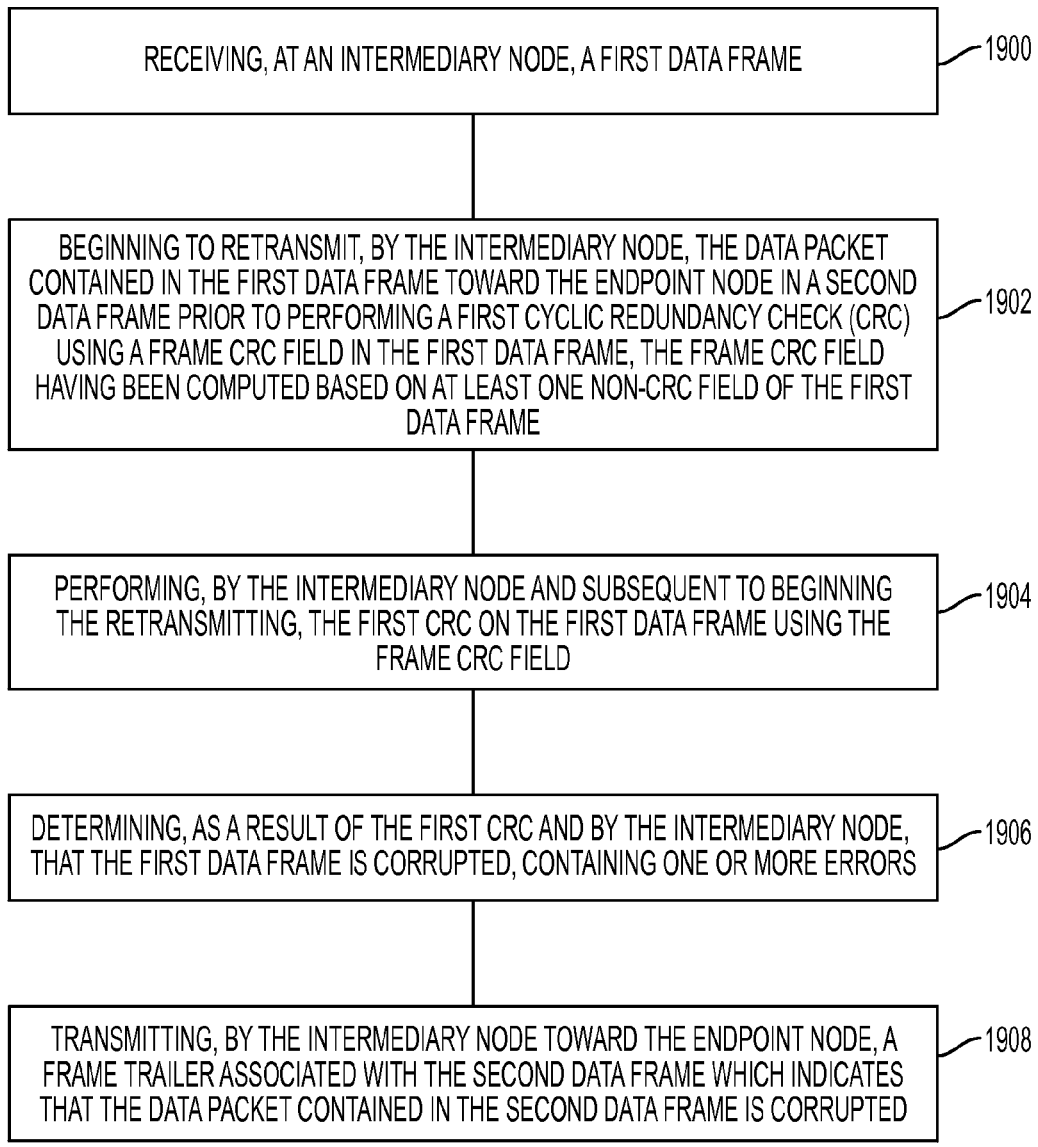
FIG. 19 is a flowchart illustrating a method for transmitting data from an intermediary node toward an endpoint according to an exemplary embodiment.

Thus, according to one exemplary embodiment, a method for transmitting data from an intermediary node toward an endpoint node includes the steps illustrated in the flowchart of FIG. 19. Therein, at step 1900, a first data frame is received at an intermediary node, e.g. node B in FIG. 13. At step 1902, this intermediate node begins to retransmit the data packet contained in the first data frame toward the endpoint node (e.g., Node C in FIG. 13) in a second data frame prior to performing a first cyclic redundancy check (CRC) using a frame CRC field in the first data frame, the frame CRC field having been computed based on at least one non-CRC field of the first data frame. The intermediary node performs, subsequent to beginning the retransmitting of the data packet, the first CRC on the first data frame using the frame CRC field as shown in step 1904. Then, the intermediary node determines, at step 1906, that the first data frame is corrupted, i.e., contains one or more errors. As a result, at step 1908, the intermediary node transmits a frame trailer associated with the second data frame which indicates that the data packet contained in the second data frame is corrupted.

Figure 20:
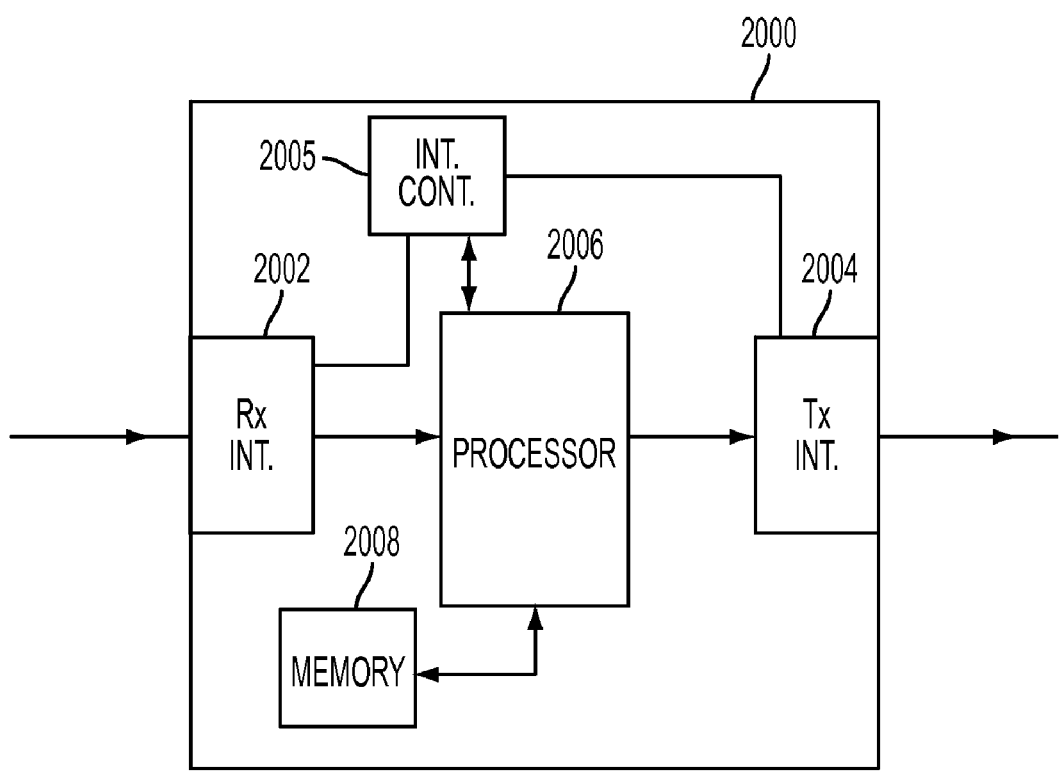
FIG. 20 depicts a node, e.g., an intermediary node or an endpoint node, according to an exemplary embodiment.

It will be appreciated by those skilled in the art that the method illustrated in FIG. 19, and other methods associated with the afore-described exemplary embodiments, can be implemented using various node structures and architectures as part of an interconnected system. A general illustration of an intermediary node (switching device) or endpoint node (e.g., frame data receiver) 2000 which handles cut-through packets in the manner described above is provide as FIG. 20. Therein, when operating as an intermediary node for example, the node 2000 can include a first interface 2002 configured to receive a first data frame, and a second interface 2004 configured to begin retransmitting the data packet contained in the first data frame as a second data frame toward an endpoint node prior to performing a first cyclic redundancy check (CRC) using a frame CRC field in the first data frame, the frame CRC field having been computed based on at least one non-CRC field of the first data frame. The first and second interfaces can be controlled by an interface controller 2005. The node 2000 can also include a processor 2006 configured to perform, subsequent to beginning the retransmitting, the first CRC on the first data frame using the frame CRC field and to determine, as a result of the CRC on the first data frame, that the first data frame is corrupted, containing one or more errors. The switching device can be further configured, e.g., in conjunction with the processor 2006, to transmit, via the second interface 2004, a frame trailer associated with the second data frame which indicates that the data packet contained in the second data frame is corrupted. A memory device 2008 can also be provided which, among other things, can operate as a retransmission buffer as described above.

When node 2000 is operating as an endpoint node (or any cut-through frame data receiver), the first interface 2002 can be configured to receive a cut-through data frame. The processor 2006 can then be configured to evaluate a data field other than a cyclic redundancy check (CRC) field associated with the cut-through data frame to determine whether the cut-through data packet is corrupted, i.e., containing one or more errors.

Figure 21:
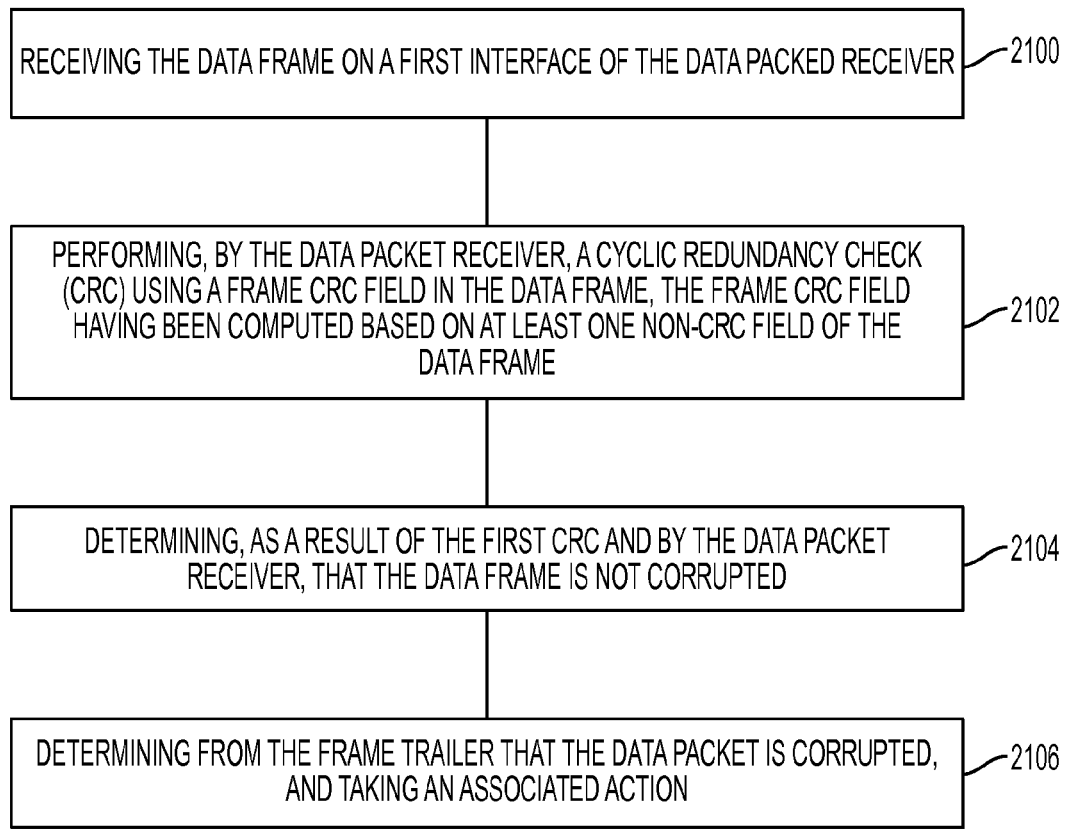
FIG. 21 is a flowchart illustrating a method for receiving a data frame according to an exemplary embodiment.

Thus, a method for receiving a data frame comprising a data packet and having a first frame trailer, at a frame data receiver, according to an exemplary embodiment is illustrated in the flow chart of FIG. 21. Therein, at step 2100, the data frame is received on a first interface of the frame data receiver. A cyclic redundancy check (CRC) is performed by the frame data receiver at step 2102, using a frame CRC field in said data frame, the frame CRC field having been computed based on at least one non-CRC field of the data frame. As a result of the first CRC and by the frame data receiver, it is determined that the data frame is not corrupted at step 2104. However it is determined, from the frame trailer, that the data packet is corrupted, and an associated action, e.g., one of those described above, is taken at step 2106.

Numerous variations of the afore-described exemplary embodiments are contemplated. The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, used herein, the article a is intended to include one or more items.

The invention claimed is:

1. A method for transmitting data toward an endpoint node, the method comprising:
   receiving, at an intermediary node, a first data frame comprising a data packet;
   beginning to retransmit, by the intermediary node, the data packet contained in said first data frame toward said endpoint node in a second data frame prior to performing a first cyclic redundancy check (CRC) using a frame CRC field in said first data frame, said frame CRC field having been computed based on at least one non-CRC field of said first data frame;
   performing, by said intermediary node and subsequent to beginning said retransmitting, said first CRC on said first data frame using said frame CRC field;
   determining, as a result of said first CRC and by said intermediary node, that said first data frame is corrupted, containing one or more errors; and
   transmitting, by said intermediary node toward said endpoint node, a frame trailer associated with said second data frame which indicates that said data packet contained in said second data frame is corrupted, containing one or more errors.

2. The method of claim 1, wherein said frame CRC field is computed based on all non-CRC fields of said first data frame.

3. The method of claim 1, wherein said first data frame further comprises a header CRC field, said header CRC field having been computed based on at least one non-CRC field of a header of said first frame, a header of said data packet and at least a portion of a payload of said data packet, the method further comprising:
   performing, by said intermediary node, a second CRC using said header CRC field prior to beginning retransmission of said data packet; and
   discarding said data packet, instead of retransmitting said data packet, if said at least one header field fails said second CRC.

4. The method of claim 1, wherein said first data frame does not include a header CRC field, the step of retransmitting further comprising:
   beginning retransmission of said data packet when a layer three (L3) destination device identification field in said data packet has been received by said intermediary node.

5. The method of claim 1, wherein said step of transmitting, by said intermediary node, the frame trailer further comprises:
   adding a special Layer 2 symbol as said frame trailer in said second data frame, said special Layer 2 symbol being indicative that said second data frame is corrupted.

6. The method of claims 5, further comprising:
   computing a second frame CRC field for said second data frame being retransmitted, and appending said second frame CRC field to said second data frame and transmitting said second frame CRC field therewith.

7. The method of claim 1, wherein said step of transmitting said frame trailer further comprises:
   setting a flag in a frame trailer in said second data frame, said flag being indicative that said second data frame is corrupted.

8. A switching device comprising:
   a first interface configured to receive a first data frame;
   a second interface configured to begin retransmitting the data packet contained in the first data frame as a second data frame toward an endpoint prior to performing a first cyclic redundancy check (CRC) using a frame CRC field in said first data frame, said frame CRC field having been computed based on at least one non-CRC field of said first data frame;
   an interface controller configured to control said first and second interfaces;
   a processor configured to perform, subsequent to beginning said retransmitting, said first CRC on said first data frame using said frame CRC field and to determine, as a result of said CRC on said first data frame, that said first data frame is corrupted, containing one or more errors; and
   said switching device is further configured to transmit, via said second interface, a frame trailer associated with said second data frame which indicates that said data packet contained in the second data frame is corrupted.

9. The switching device of claim 8, wherein said frame CRC field is computed based on all non-CRC fields of said first data frame.

10. The switching device of claim 8, wherein said first data frame further comprises a header CRC field, said header CRC field having been computed based on at least one non-CRC field of a header of said first frame, a header of said packet and at least a portion of a payload of said data packet, wherein said processor is further configured to perform a second CRC on said at least one header field prior to beginning retransmission of said data packet via said second interface; and wherein
   said switching device is further configured to discard said data packet, instead of retransmitting said data packet, if said second CRC fails.

11. The switching device of claim 8, wherein said first data frame does not include a header CRC field, the switching device further being configured to begin retransmission of said data packet via said second interface when a layer three (L3) destination device identification field in said data packet has been received on said first interface.

12. The switching device of claim 8, wherein said frame trailer is added as a special Layer 2 symbol to said frame trailer, said special Layer 2 symbol being indicative that said data packet is corrupted.

13. The switching device of claims 12, wherein said processor is further configured to appending a correct frame CRC field to said second data frame being transmitted.

14. The switching device of claim 8, said frame trailer further comprises a flag that, when set, indicates that the second data frame is corrupted.

15. A method for receiving a data frame comprising a data packet and having a first frame trailer, at a frame data receiver, comprising:
   receiving the data frame on a first interface of the frame data receiver;
   performing, by said frame data receiver, a cyclic redundancy check (CRC) using a frame CRC field in said data frame, said frame CRC field having been computed based on at least one non-CRC field of said data frame;

determining, as a result of said CRC and by said frame data receiver, that said data frame is not corrupted; and determining from said frame trailer that said data packet is corrupted, containing one or more errors, and taking an associated action.

16. The method of claim 15, wherein the associated action is to discard the data packet.

17. The method of claim 15, wherein the associated action is to maintain the data packet and send a signal indicating that said data packet is corrupted.

18. The method of claim 15, wherein said determining that said data packet is corrupted comprises detecting that a special Layer 2 symbol is present in said frame trailer, said special Layer 2 symbol being indicative that said data packet is corrupted.

19. The method of claim 15, wherein said determining that said data packet is corrupted comprises detecting that said frame trailer comprises a flag that, when set, is indicative that said data frame is corrupted.

20. The method of claim 15, wherein the associated action further comprises:

skipping the transmission of a negative acknowledgement control (NAC) frame.

21. The method of claim 15, wherein the associated action further comprises:

removing the data frame from a retransmission buffer and rolling back a frame sequence number.

22. A frame data receiver comprising:

an interface configured to receive a cut-through data frame comprising a data packet and having a frame trailer; and one or more processors configured to:

perform a cyclic redundancy check (CRC) using a frame CRC field in said data frame, said frame CRC field having been computed based on at least one non-CRC field of said data frame;

determine, as a result of said CRC, that said data frame is not corrupted; and determine from said frame trailer that said data packet is corrupted, containing one or more errors, and initiate an associated action.

23. The frame data receiver of claim 22, wherein determining that said data packet is corrupted comprises detecting that a special Layer 2 symbol is present in said frame trailer, said special Layer 2 symbol being indicative that said data packet is corrupted.

24. The frame data receiver of claim 23, wherein determining that said data packet is corrupted comprises detecting that said frame trailer comprises a set flag, said set flag being indicative that the data frame is corrupted.

25. The frame data receiver of claim 22, wherein determining that said cut-through data frame is not corrupted includes detecting that a correct frame CRC field is present in the data frame.

\* \* \* \* \*